(12) United States Patent
Park et al.

(10) Patent No.: US 9,171,621 B2
(45) Date of Patent: Oct. 27, 2015

(54) NON-VOLATILE MEMORY (NVM) AND METHOD FOR MANUFACTURING THEREOF

(71) Applicant: ELECTRONICS AND TELECOMMUNICATIONS RESEARCH INSTITUTE, Daejeon (KR)

(72) Inventors: Kun Sik Park, Daejeon (KR); Kyu Ha Baek, Daejeon (KR)

(73) Assignee: Electronics and Telecommunications Research Institute, Daejeon (KR)

(*) Notice: Subject to any disclaimer, the term of this patent is extended or adjusted under 35 U.S.C. 154(b) by 124 days.

(21) Appl. No.: 13/871,300

(22) Filed: Apr. 26, 2013

(65) Prior Publication Data

US 2013/0294172 A1    Nov. 7, 2013

(30) Foreign Application Priority Data

Apr. 27, 2012  (KR) .................. 10-2012-0044754
Apr. 24, 2013  (KR) .................. 10-2013-0045492

(51) Int. Cl.
| | |
|---|---|
| *G11C 16/04* | (2006.01) |
| *H01L 29/788* | (2006.01) |
| *H01L 29/66* | (2006.01) |
| *H01L 27/115* | (2006.01) |

(52) U.S. Cl.
CPC ........ *G11C 16/0425* (2013.01); *G11C 16/0441* (2013.01); *H01L 27/11558* (2013.01); *H01L 29/66825* (2013.01); *H01L 29/788* (2013.01); *H01L 29/7881* (2013.01); *G11C 2216/10* (2013.01)

(58) Field of Classification Search
CPC ....... G11C 16/10; G11C 16/12; H01L 27/115
USPC ........................................ 365/185.28, 185.18
See application file for complete search history.

(56) References Cited

U.S. PATENT DOCUMENTS

| | | | |
|---|---|---|---|
| 6,631,087 B2 | 10/2003 | Di Pede et al. | |
| 7,700,994 B2 | 4/2010 | Roizin et al. | |

(Continued)

FOREIGN PATENT DOCUMENTS

| | | |
|---|---|---|
| CN | 101789432 A | 7/2010 |
| KR | 2010-0079306 | 8/2010 |

OTHER PUBLICATIONS

Katsuhiko Ohsaki et al. "A Single Poly EEPROM Cell Structure for Use in Standard CMOS Processes", IEEE Journal of Solid-State Circuits, vol. 29, No. 3, Mar. 1994 (pp. 311-316, in English).

*Primary Examiner* — Huan Hoang
(74) *Attorney, Agent, or Firm* — NSIP Law

(57) ABSTRACT

A nonvolatile memory and a method of manufacturing a nonvolatile memory are disclosed. A nonvolatile memory according to an exemplary embodiment may include a deep well formed on a substrate, a first well formed within the deep well, a second well formed separately from the first well within the deep well, a first metal-oxide-semiconductor field-effect transistor (MOSFET) formed on the first well, and a second MOSFET formed on the second well. According to a method of manufacturing a nonvolatile memory according to an exemplary embodiment, a well region of a control MOSFET of a memory cell may be shared with a control MOSFET of an adjacent memory cell, or a well region of a tunneling MOSFET of a memory cell may be shared with a tunneling MOSFET of an adjacent memory cell, thereby reducing an area of the memory cells. Further, the nonvolatile memory according to the exemplary embodiment may constantly maintain a voltage of a shared well region in the tunneling MOSFET and apply a different voltage to a source/drain from that of an adjacent cell, thereby recording data only in the selected memory cell or deleting recorded data from the selected memory cell while sharing the well region.

13 Claims, 11 Drawing Sheets

(56) References Cited

U.S. PATENT DOCUMENTS

| | | |
|---|---|---|
| 2009/0085109 A1* | 4/2009 | Izumi .......................... 257/334 |
| 2009/0201742 A1* | 8/2009 | Lee et al. ................ 365/185.24 |
| 2010/0157669 A1* | 6/2010 | Audzeyeu et al. ......... 365/185.1 |
| 2011/0180878 A1* | 7/2011 | Tai et al. ...................... 257/369 |
| 2011/0216595 A1* | 9/2011 | Yoon et al. ............... 365/185.15 |

* cited by examiner

NON-VOLATILE MEMORY (NVM) AND METHOD FOR MANUFACTURING THEREOF

CROSS-REFERENCE TO RELATED APPLICATION(S)

This application claims the benefit under 35 USC §119(a) of Korean Patent Application No. 10-2012-0044754, filed on Apr. 27, 2012, in the Korean Intellectual Property Office and Korean Patent Application No. 10-2013-0045492, filed on Apr. 24, 2013, in the Korean Intellectual Property Office, the entire disclosure of which is incorporated herein by reference for all purposes.

BACKGROUND

1. Field

The present invention relates to a nonvolatile memory and a method of manufacturing a nonvolatile memory, and more particularly, to a structure of a single polysilicon electrically erasable programmable read only memory (EEPROM) capable of performing recording, deleting and reading operations at a low voltage, a method of manufacturing the same, and an operation method of the same.

2. Description of Related Art

As a nonvolatile memory device using a silicon semiconductor process, a dual polysilicon electrically erasable programmable read only memory (EEPROM), in which double layers of polysilicon are staked as a floating gate and a control gate, and a flash memory are generally used. Despite its small cell size, this stacked gate-type memory involves a complicated circuit and manufacturing process and thus is not proper for a low-density and low-cost memory.

Storage devices with a comparatively small memory capacity and inexpensiveness are needed in various fields using a radio-frequency identification (RFID) chip. Here, a single polysilicon EEPROM compatible with a complementary metal-oxide-semiconductor (CMOS) is generally used.

The single polysilicon EEPROM may be programmed by two methods. A first method is channel hot electron injection. According to a programming method using channel hot electron injection, a strong electric field is formed in a channel region between a source electrode and a drain electrode, and part of electrons having a high kinetic energy by the strong electric field pass through a potential barrier of an oxide layer to be injected into a floating gate. The electrons injected into the floating gate are isolated by a potential barrier of an insulating layer, resulting in an increase in a threshold voltage of the MOS.

A second method is Fowler-Nordheim (F-N) tunneling. According to a programming method using F-N tunneling, as a high electric field is applied to an oxide between a gate and a source/drain/well electrode, an tunneling current exponentially increases with respect to the electronic field. The high electric field may cause an F-N tunneling phenomenon of electrons in the MOS, so that electrons may be injected into the floating gate and the threshold voltage of the MOS may increase accordingly.

SUMMARY

A nonvolatile memory according to an exemplary embodiment may include a deep well formed on a substrate, a first well formed within the deep well, a second well formed separately from the first well within the deep well, a first metal-oxide-semiconductor field-effect transistor (MOSFET) formed on the first well, and a second MOSFET formed on the second well.

The nonvolatile memory may have a reduced area of memory cells by sharing a well region of the first MOSFET (control MOS) with a first MOSFET of an adjacent memory cell or sharing a well region of the second MOSFET (tunneling MOS) with a second MOSFET of an adjacent memory cell.

The nonvolatile memory may constantly maintain a voltage of a shared well region in the second MOSFET and apply a different voltage to a source/drain from that of the adjacent cell, thereby recording data only in a selected memory cell or deleting recorded data from the selected memory cell while sharing the well region.

A method of recording data in a memory cell according to an exemplary embodiment may record data using Fowler-Nordheim (F-N) tunneling by constantly maintaining a voltage of a shared well and varying voltages of a source/drain. Further, the method may record data using channel hot electron injection by constantly maintaining voltages of the shared well and the source and varying a voltage of the drain.

A method of deleting data from a memory cell according to an exemplary embodiment may delete data using F-N tunneling by constantly maintaining a voltage of a shared well and varying voltages of a source/drain. Further, the method may delete data using band-to-band tunneling by constantly maintaining voltages of the shared well and the source and varying a voltage of the drain.

The nonvolatile memory may further include a selector transistor formed on the second well.

A method of manufacturing a nonvolatile memory according to an exemplary embodiment may include forming a deep well on a substrate, forming a first well and a second well separated from the first well within the deep well, forming a gate insulating layer on the first and second wells, forming a floating gate on the gate insulating layer, and forming a diffusion region within the deep well, the first well and the second well.

The method of manufacturing the nonvolatile memory may further include forming a third well shallower than the deep well between the first well and the second well within the deep well.

A nonvolatile memory according to another exemplary embodiment may include a first deep well formed on a substrate, a first well formed within the first deep well, a first MOSFET formed on the first well, a second deep well formed separately from the first deep well on the substrate, a second well formed within the second deep well, and a second MOSFET formed on the second well.

The nonvolatile memory may further include a third well formed between the first deep well and the second deep well to separate the first deep well from the second deep well.

A method of manufacturing a nonvolatile memory according to another exemplary embodiment may include forming first and second deep wells on a substrate, forming a first well within the first deep well and a second well separated within the second deep well, forming a gate insulating layer on the first and second wells, forming a floating gate on the gate insulating layer, and forming a diffusion region within the first and second deep wells and the first and second wells.

The method of manufacturing the nonvolatile memory may further include forming a third well between the first deep well and the second deep well.

DETAILED DESCRIPTION

Figure 1:
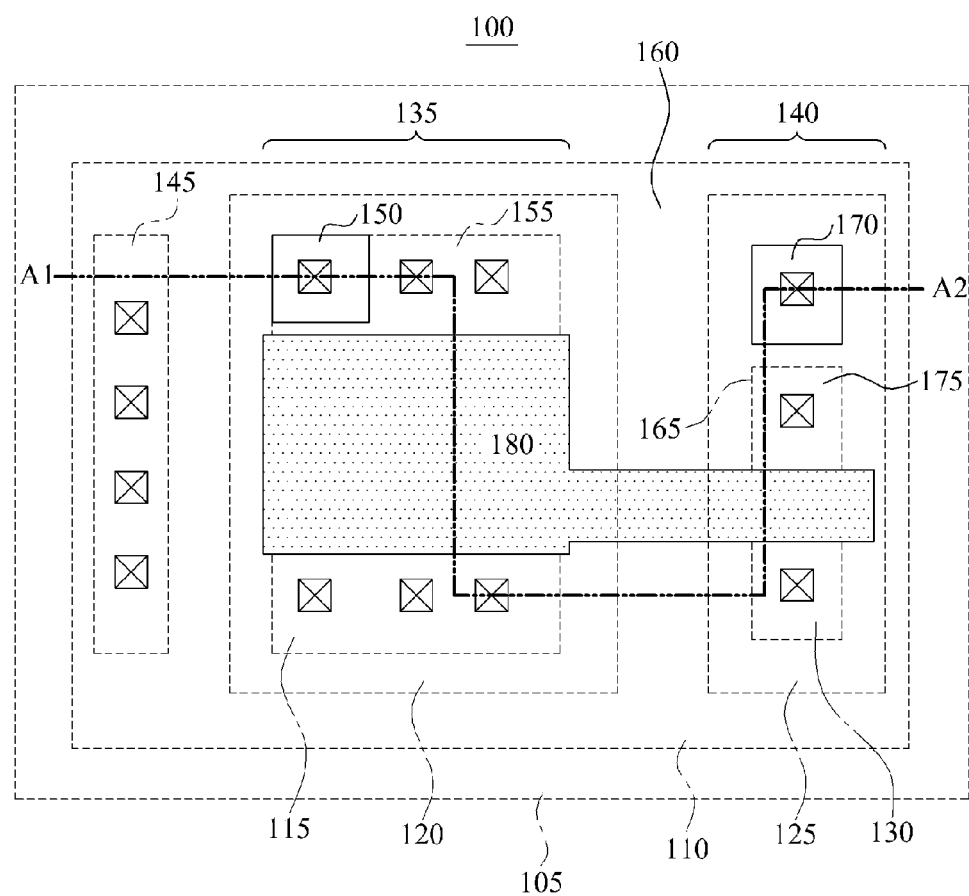
FIG. 1 is a plan view illustrating a structure of a nonvolatile memory according to an exemplary embodiment.

Hereinafter, exemplary embodiments will be described in detail with reference to the accompanying drawings. Structural and functional descriptions to be made below are provided just to explain exemplary embodiments of the present invention and are not construed as limiting the scope of the present invention. Like reference numerals refer to the like elements throughout.

In the following description, a nonvolatile memory may be a single gate nonvolatile memory with a single level of polysilicon.

FIG. 1 is a plan view illustrating a structure of a nonvolatile memory of a memory cell 100 unit according to an exemplary embodiment.

Referring to FIG. 1, the nonvolatile memory of the memory cell 100 unit may include a substrate 105, a conductive deep well 110, a conductive first well 120, a conductive second well 125, a floating gate 180, a first metal-oxide-semiconductor field-effect transistor (MOSFET) 135, and a second MOSFET 140. The first MOSFET 135 may be disposed on the first well 120, while the second MOSFET 140 may be disposed on the second well 125.

For convenience of description, suppose that the substrate 105 is a p-type substrate, the conductive deep well 110 is an n-type deep well, the conductive first well 120 and the conductive second well 125 are p-type wells, and the first MOSFET 135 and the second MOSFET 140 are n-type MOSFETs (NMOSs). Here, the foregoing illustration is provided for convenience of description and is not construed as limiting the scope of exemplary embodiments. The opposite configuration may be adopted in exemplary embodiments. For example, the substrate 105 may be an n-type substrate, the conductive deep well 110 may be a p-type deep well, the conductive first well 120 and the conductive second well 125 may be n-type wells, and the first MOSFET 135 and the second MOSFET 140 may be p-type MOSFETs (NMOSs).

The deep well 110 may be formed on the substrate 105, and the first well 120 and the second well 125 may be formed within an area of the deep well 110. A third well 160, which may be the same type as the deep well 110 and be shallower than the deep well 110, may be additionally formed in an area of the deep well 110 where the first well 120 and the second well 125 are not formed.

Further, the deep well 110 may include a diffusion region 145, which is the same type as the deep well 110, for tying the deep well 110. For example, when the deep well 110 is n-type, the diffusion region 145 may be also n-type. When the first MOSFET 135 is an NMOS, the first MOSFET 135 may include an n-type drain 115, an n-type source 155, and a p-type tie 150. Here, terminals respectively connected to the drain 115, the source 155, and the tie 150 of the first MOSFET 145 may be formed by dividing electrical wiring or connecting a plurality of wires.

When the second MOSFET 140 is an NMOS, the second MOSFET 140 may include an n-type drain 130, an n-type source 175, and a p-type tie 170, like the first MOSFET 135.

The first MOSFET 135 may control an operation of the memory cell 100, and the second MOSFET 140 may store data in the memory cell 100 or delete data stored in the memory cell 100.

The first well 120 and the second well 125 may be separated from each other, and the first MOSFET 135 formed on the first well 120 and the second MOSFET 140 formed on the second well 125 may operate as a control MOS capacitor and a tunneling MOS capacitor, respectively.

At least one of the first well 120 and the second well 125 may be shared between adjacent memory cells in the nonvolatile memory. For example, the first well 120 may be shared with a neighboring memory cell (not shown), and the second well 125 may be also shared with a neighboring memory cell. Accordingly, the nonvolatile memory formed of a plurality of memory cells may have a reduced size.

A nonvolatile memory according to an exemplary embodiment is capable of operating even at a low voltage using a control MOS capacitor and a tunneling MOS capacitor formed on two isolated wells.

A nonvolatile memory according to an exemplary embodiment may constantly maintain a voltage of a shared well region in a tunneling metal oxide semiconductor field effect transistor (MOSFET) and apply a different voltage to a source/drain from that of an adjacent cell, thereby recording data only in a selected memory cell or deleting recorded data from the selected memory cell.

Figure 2:
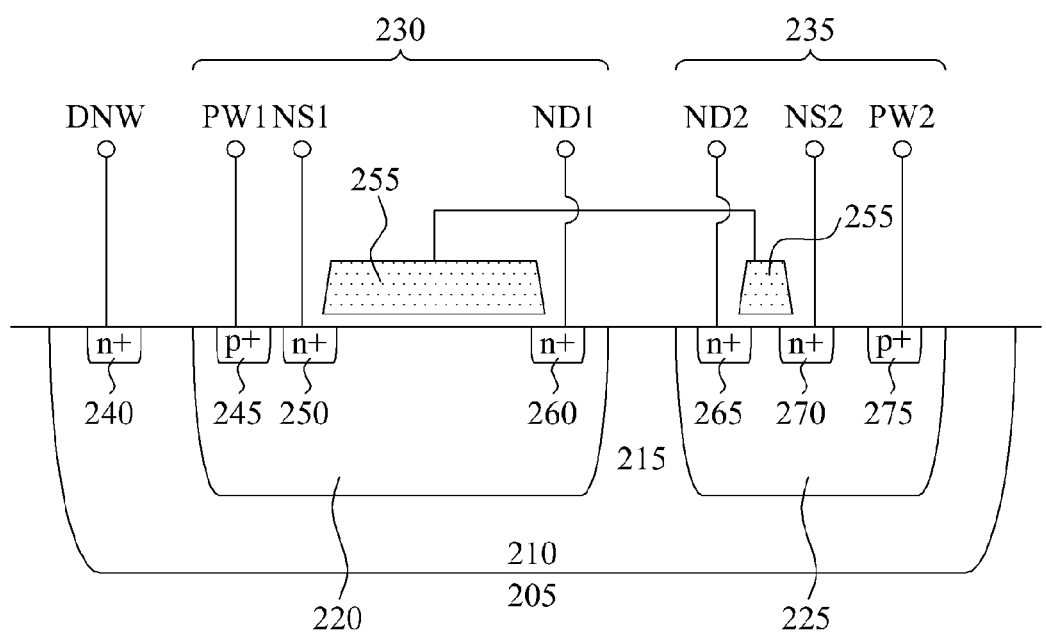
FIG. 2 is a cross-sectional view illustrating a structure of a nonvolatile memory according to an exemplary embodiment.

FIG. 2 is a cross-sectional view illustrating a structure of a nonvolatile memory of a memory cell unit according to an exemplary embodiment. In detail, FIG. 2 is a cross-sectional view of the nonvolatile memory of FIG. 1, taken along line A1-A2.

Referring to FIG. 2, the nonvolatile memory of the memory cell 200 unit may include a substrate 205, a conductive deep well 210, a conductive first well 220, a conductive second well 225, a floating gate 255, a first MOSFET 230, and a second MOSFET 235. The first MOSFET 230 may be disposed on the first well 220, while the second MOSFET 235 may be disposed on the second well 225.

The deep well 210 may include a diffusion region 240, which is the same type as the deep well 210, for tying the deep well 210. For example, when the deep well 210 is n-type, the diffusion region 240 may be also n-type. When the first MOSFET 230 is an NMOS, the first MOSFET 230 may include an n-type drain 260, an n-type source 250, and a p-type tie 245. When the second MOSFET 235 is an NMOS, the second MOSFET 235 may include an n-type drain 265, an n-type source 270, and a p-type tie 275, like the first MOSFET 230. Further, a third well 215, which may be the same type as the deep well 210 and be shallower than the deep well 210, may be additionally formed in an area of the deep well 210 where the first well 220 and the second well 225 are not formed.

Hereinafter, operations of recording data in the memory cell 200 included in the nonvolatile memory or deleting recorded data, and reading data recorded in the memory cell 200 will be described on the basis of FIG. 2.

Fowler-Nordheim (F-N) tunneling or channel hot electron injection may be used to record or program data in the memory cell 200 of the nonvolatile memory.

First, an operation of recording data in the memory cell 200 using F-N tunneling according to an exemplary embodiment will be described.

A positive voltage is applied to a terminal DNW connected to the diffusion region 240 in the deep well 210, and a positive programmable voltage for recording data is applied to at least one of a terminal ND1 connected to the drain 260 of the first MOSFET 230, a terminal NS1 connected to the source 250 thereof and a terminal PW1 connected to the tie 245 thereof. A voltage of 0 V or a negative programmable voltage is applied to a terminal PW2 connected to the tie 275 of the second MOSFET 235. The diffusion region 240 for tying the deep well 210 may be floated.

Further, a negative programmable voltage is applied to at least one of a terminal ND2 connected to the drain 265 of the second MOSFET 235 and a terminal NS2 connected to the source 270 thereof in the memory cell 20 selected for a program, that is, selected for recording data. Terminals connected to a drain and a source of a second MOSFET (not shown) included in a memory cell (not shown) not selected for the program are floated or are applied with a voltage of 0 V.

In this setting, a positive voltage is induced in the floating gate 255 of the second MOSFET 235 in the memory cell 200 selected for the program according to a coupling ratio between the first MOSFET 230 and the second MOSFET 235, and a channel region formed between the drain 265 and the source 270 of the second MOSFET 235 satisfies an inversion condition. Since electrons may be provided from the drain 265 or the source 270 of the second MOSFET 235 applied with the negative programmable voltage and from both the drain 265 and the source 270, a strong electric field may be formed in a direction from the floating gate 255 to the drain 265, the source 270 and the channel region between the drain 265 and the source 270 of the second MOSFET 235. The electric field formed in the direction to the drain 265, the source 270 and the channel region of the second MOSFET 235 may generate F-N tunneling, so that electrons may be injected into the floating gate 255.

On the contrary, in the memory cell 200 not selected for the program, although a positive voltage is induced in the floating gate 255 of the second MOSFET 235, the drain 265 and the source 270 of the second MOSFET 235 are floated or connected to a ground, and thus electrons are not provided to the channel region between the drain 265 and the source 270 of the second MOSFET 235. Thus, the channel region of the second MOSFET 235 becomes in a deep depletion state in the memory cell 200 not selected for the program. In this case, an intensity of the electronic field formed in the direction from the floating gate 255 to the drain 264, the source 257 and the channel region of the second MOSFET 235 is not sufficient to cause F-N tunneling, so that electrons are not injected into a floating gate 255 of the memory cell 200 not selected for the program.

Next, an operation of recording data in the memory cell 200 using channel hot electron injection according to an exemplary embodiment will be described.

A positive voltage is applied to the terminal DNW connected to the diffusion region 240 of the deep well 210, and a positive programmable voltage for recoding data, is applied to at least one of the terminal ND1 connected to the drain 260 of the first MOSFET 230, the terminal NS1 connected to the source 250 thereof and the terminal PW1 connected to the tie 245 thereof. The terminal PW2 connected to the tie 275 of the second MOSFET 235 and the terminal NS2 connected to the source 270 are connected to a ground, that is, a voltage of 0 V. The diffusion region 240 for tying the deep well 210 may be floated.

Further, a positive programmable voltage is applied to the terminal ND2 connected to the drain 265 of the second MOSFET 235 in the memory cell 200 selected for the program, while the terminal connected to the drain of the second MOSFET (not shown) included in the memory cell not selected for the program is floated or is applied with a ground voltage of 0 V.

In this setting, a positive voltage is induced in the floating gate 255 of the second MOSFET 235 in the memory cell 200 selected for the program according to a coupling ratio between the first MOSFET 230 and the second MOSFET 235, and the channel region formed between the drain 265 and the source 270 of the second MOSFET 235 satisfies an inversion condition. Thus, the second MOSFET 235 is turned on, and accordingly an electric current flows from the drain 265 to the source 270 of the second MOSFET 235 by the programmable voltage applied to the terminal ND2 of the second MOSFET 235. Channel hot electrons, which have a high kinetic energy in a channel, generated in a drain junction area or the channel region between the drain 265 and the source 270 of the second MOSFET 235 may be injected into the floating gate 255 over a gate insulating layer of the second MOSFET 235. As the channel hot electrons are injected into the floating gate 255, a threshold voltage of the second MOSFET 235 may increase.

On the contrary, in the memory cell 200 not selected for the program, since the drain 265 of the second MOSFET 235 is floated or connected to the ground, an electric current does not flow from the drain 265 to the source 270 of the second MOSFET 235. Thus, channel hot electrons are not generated and thus not injected into the floating gate 255.

Referring to FIG. 2, an operation of deleting data recorded in the memory cell 210 included in the nonvolatile memory will be described. F-N tunneling or band-to-band tunneling may be used to delete the data recorded in the memory cell 200 included in the nonvolatile memory.

First, an operation of deleting data recorded in the memory cell 200 using F-N tunneling according to an exemplary embodiment will be described.

The terminal DNW connected to the diffusion region 240 in the deep well 210 is applied with a voltage of 0 V or is floated, and a negative programmable voltage for deleting data is applied to at least one of the terminal ND1 connected to the drain 260 of the first MOSFET 230, the terminal NS1 connected to the source 250 thereof, and the terminal PW1 connected to the tie 245 thereof. The terminal PW2 connected to the tie 275 of the second MOSFET 235 is applied with a voltage of 0 V or floated.

In the memory cell 200 selected with respect to deletion, a positive programmable voltage is applied to at least one of the terminal ND2 connected to the drain 265 and the terminal NS2 connected to the source 270 of the second MOSFET 235. Terminals connected to a drain and a source of a second MOSFET (not shown) included in another memory cell (not shown) not selected with respect to deletion are floated or applied with a ground voltage of 0 V.

In this setting, a negative voltage is induced in the floating gate 255 of the second MOSFET 235 in the memory cell 200 selected with respect to deletion according to a coupling ratio between the first MOSFET 230 and the second MOSFET 235. Further, a strong electric field is formed in a direction from the drain 265 or the source 270 of the second MOSFET 235 applied with the positive voltage to the floating gate 255, thereby removing electrons of the floating gate 255 by F-N tunneling.

On the contrary, in the memory cell 200 not selected with respect to deletion, a negative voltage is induced in the floating gate 255 of the second MOSFET 235. However, since the drain 265 and the source 270 of the second MOSFET 235 are floated or connected to the ground, an intensity of the electric field formed in the direction from the drain 265 or the source 270 of the second MOSFET 235 to the floating gate 255 is not sufficient to cause F-N tunneling. Thus, electrons present in the floating gate 255 of the memory cell 200 not selected with respect to deletion are not removed.

An operation of deleting data recorded in the memory cell 200 using band-to-band tunneling according to an exemplary embodiment is described.

The terminal DNW connected to the diffusion region 240 in the deep well 210 is applied with a voltage of 0 V or is floated, and a negative programmable voltage for deleting data is applied to at least one of the terminal ND1 connected to the drain 260 of the first MOSFET 230, the terminal NS1 connected to the source 250 thereof, and the terminal PW1 connected to the tie 245 thereof. The terminal PW2 connected to the tie 275 of the second MOSFET 235 is floated or applied with a negative programmable voltage.

In the memory cell 200 selected with respect to deletion, a positive programmable voltage is applied to the terminal ND2 connected to the drain 265 of the second MOSFET 235, and a ground voltage is applied to the terminal NS2 connected to the source 270 of the second MOSFET 235. Terminals connected to a drain and a source of a second MOSFET (not shown) included in another memory cell (not shown) not selected with respect to deletion are floated or applied with a ground voltage of 0 V.

In this setting, a negative voltage is induced in the floating gate 255 of the second MOSFET 235 in the memory cell 200 selected with respect to deletion according to a coupling ratio between the first MOSFET 230 and the second MOSFET 235. Holes are accumulated in the channel region of the second MOSFET 235 by the negative voltage induced in the floating gate 255 of the second MOSFET 235, and a reverse bias voltage is applied to a P-N junction area with the drain 265 of the second MOSFET 235 applied with the positive voltage. Further, an electric field in the drain 265 of the second MOSFET 235 becomes much stronger by the negative voltage induced in the floating gate 255 of the second MOSFET.

The electric field in the drain 265 of the second MOSFET 235 generates electron-hole pairs in a junction area between the drain 265 and the channel region of the second MOSFET 235 by band-to-band tunneling, and the generated electrons are transferred to the drain of the second MOSFET 235. The generated holes travel along the channel to generate electron-hole pairs by impact ionization, and holes that obtain energy are injected into the floating gate 255 of the second MOSFET 235 to delete the data, that is, electrons are removed by holes.

Finally, an operation of reading data recorded in the memory cell 200 according to an exemplary embodiment will be described.

The terminal DNW connected to the diffusion region 240 in the deep well 210, the terminal ND1 connected to the drain 260 of the first MOSFET 230, the terminal NS1 connected to the source 250 thereof, and the terminal PW1 connected to the tie 245 thereof are applied with a positive voltage or floated. A ground voltage is applied to the terminal NS2 connected to the source 270 of the second MOSFET 235 and the terminal PW2 connected to the tie 275, and a positive reading voltage is applied to the terminal ND2 connected to the drain 265.

In this setting, when the memory cell 200 is programmed, that is, when electrons are injected into the floating gate 255, the second MOSFET 235 is turned off, and thus an electric current does not flow between the drain 265 and the source 270 of the second MOSFET 235. Further, when data stored in the memory cell 200 is deleted, that is, when electrons are removed from the floating gate 255, the second MOSFET 235 is turned on, and thus an electric current flows between the drain 265 and the source 270 of the second MOSFET 235. Flow of an electric current between the drain 265 and the source 270 of the second MOSFET 235 is determined based on whether electrons are injected into the floating gate 255, on which it may be determined whether the corresponding memory cell 200 is programmed or data is deleted from the memory cell 200.

The operations of recording data in the memory cell 200 of the nonvolatile memory or deleting or reading recorded data have been described with reference to FIG. 2. To sum up, Table 1 is given as follows.

TABLE 1

| Classification | | DNW | PW1 | NS1 | ND1 | PW2 | NS2 | ND2 |
|---|---|---|---|---|---|---|---|---|
| 1) Recording using F-N tunneling | First memory cell selected for program | +V11 or Floating | 0 V~+V1 | +V1 | +V1 | −V2~0 V | −V2 | −V2 |
| | Second memory cell not selected for program | +V11 or Floating | 0 V~+V1 | +V1 | +V1 | −V2~0 V | 0 V or Floating | 0 V or Floating |
| 2) Recording using channel hot electron injection | First memory cell selected for program | +V11 or Floating | 0 V~+V3 | +V3 | +V3 | 0 V | 0 V | +V4 |
| | Second memory cell not selected for program | +V11 or Floating | 0 V~+V3 | +V3 | +V3 | 0 V | 0 V or Floating | 0 V or Floating |
| 3) Deletion using F-N | First memory cell selected | 0 V or Floating | −V5 | −V5 | −V5 | 0 V or Floating | +V6 | +V6 |

TABLE 1-continued

| Classification | | DNW | PW1 | NS1 | ND1 | PW2 | NS2 | ND2 |
|---|---|---|---|---|---|---|---|---|
| tunneling | for program Second memory cell not selected for program | 0 V or Floating | −V5 | −V5 | −V5 | 0 V or Floating | 0 V or Floating | 0 V or Floating |
| 4) Deletion using band-to-band tunneling | First memory cell selected for program | 0 V or Floating | −V7 | −V7 | −V7 | Floating or −VDNW (0 V~−V7) | 0 V | +V8 |
| | Second memory cell not selected for program | 0 V or Floating | −V7 | −V7 | −V7 | Floating or −VDNW (0 V~−V7) | 0 V or Floating | 0 V or Floating |
| 5) Reading | First memory cell selected for program | V9 or Floating | +V9 or Floating | +V9 or Floating | +V9 or Floating | 0 V | 0 V | +V10 |

In Table 1, voltages V1 to V11 are voltages to be applied to each terminal of the first MOSFET 230 or the second MOSFET 235 based on recording/deletion/reading operations and denote preset levels of voltages.

The operation of recording the data in the memory cell 200 may be carried out through a combination of methods 1) and 2) in Table 1. For example, F-N tunneling may be used to record data in the memory cell 200 for a certain period of time, and channel hot electron injection may be used to record data in the memory cell 200 for a different period of time.

Also, the operation of deleting the data recorded in the memory cell 200 may be carried out by a combination of one or more methods among 3) to 5) in Table 1. For example, F-N tunneling may be used to delete the data recorded in the memory cell 200 for a certain period of time, and band-to-band tunneling may be used to delete the data for a different period of time.

The nonvolatile memory described above may be manufactured of single polysilicon and record/delete/read data at a low voltage. Thus, the nonvolatile memory may not need an element that is able to endure a high voltage, such as a laterally diffused MOSFET (LDMOSFET), and be fabricated without an additional process in a CMOS process.

Further, the nonvolatile memory may use F-N tunneling, F-N tunneling and band-to-band tunneling, or F-N tunneling and channel hot electron injection in recording/deleting data and thus consumes less power.

In addition, since the second MOSFET 235 functioning as a tunneling region also serve as a transistor to read data and power is applied separately to the second well 225 in the tunneling region and a region of the source 270/drain 265, the second well 225 may be shared with an adjacent memory cell, thereby reducing a size of the nonvolatile memory.

Figure 3:
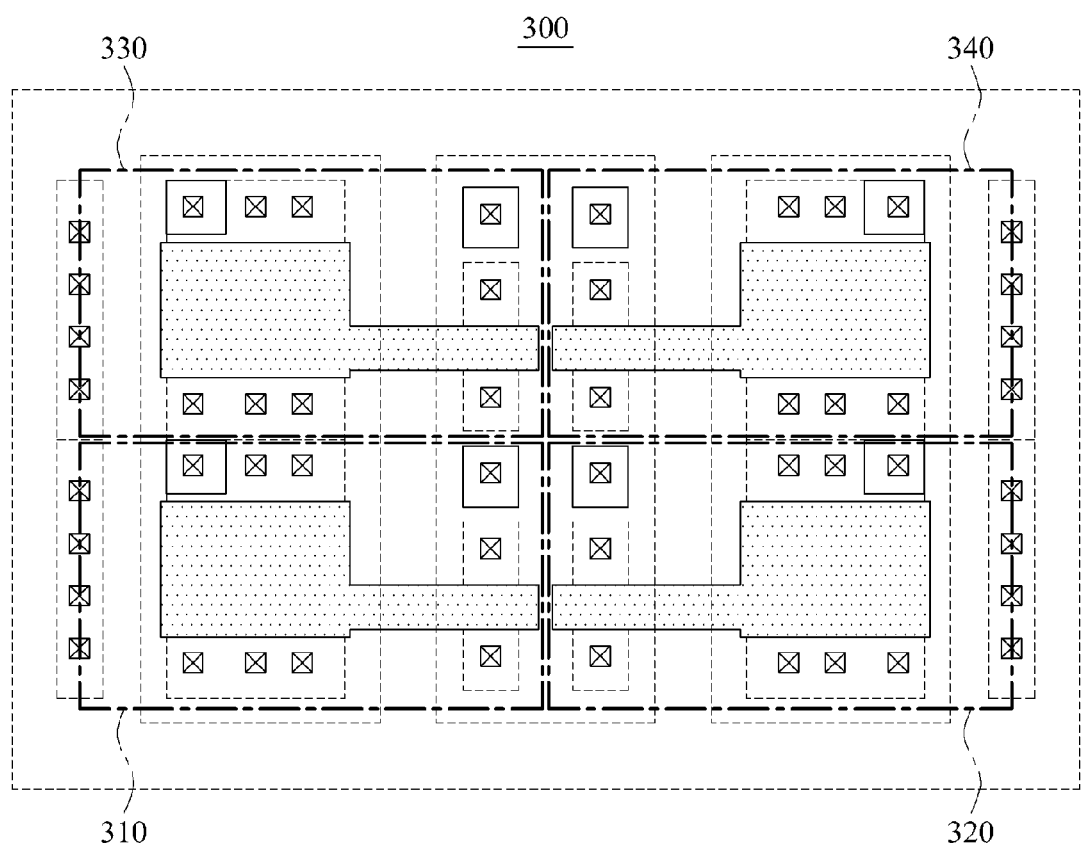
FIG. 3 is a plan view illustrating a structure of a nonvolatile memory in which a plurality of memory cells are set in array according to an exemplary embodiment.

FIG. 3 is a plan view illustrating a structure of a nonvolatile memory in which a plurality of memory cells are set in array according to an exemplary embodiment.

The nonvolatile memory 300 of FIG. 3 includes a plurality of memory cells d described with reference to FIGS. 1 and 2. In detail, the nonvolatile memory 300 of FIG. 3 may include four memory cells 310, 320, 330 and 340.

The memory cells 310, 320, 330 and 340 may share a second well. Memory cells 310 and 330 or 320 and 340 neighboring up and down may share a first well. Thus, the nonvolatile memory including the plurality of memory cells may have a reduced size. A structure of adjacent memory cells may be symmetric or the same.

FIGS. 4 to 7 show various illustrative structures of a first MOSFET.

In FIGS. 4 to 7, suppose that the first MOSFET is an NMOS for convenience of description. According to FIGS. 4 to 7, the same level of voltage is applied to a drain, a source and a tie of the first MOSFET, the first MOSFET may have an MOS capacitor structure. Further, the first MOSFET may include at least one of one or more n+ type diffusion regions and one or more p+ type diffusion regions.

Figure 4:
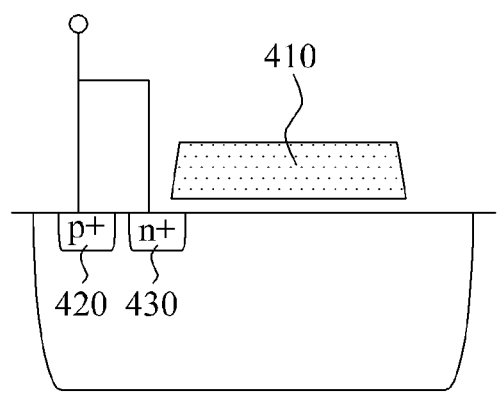
FIGS. 4 to 7 show various illustrative structures of a first metal oxide semiconductor field effect transistor (MOSFET).
Figure 5:
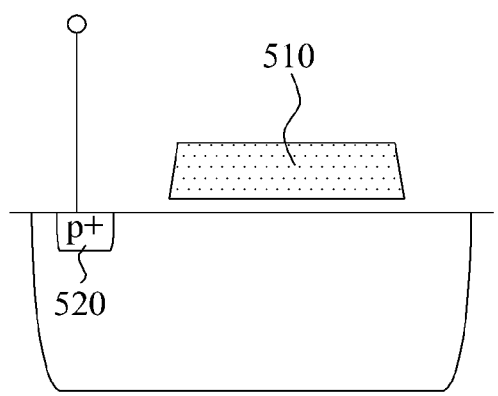
Figure 6:
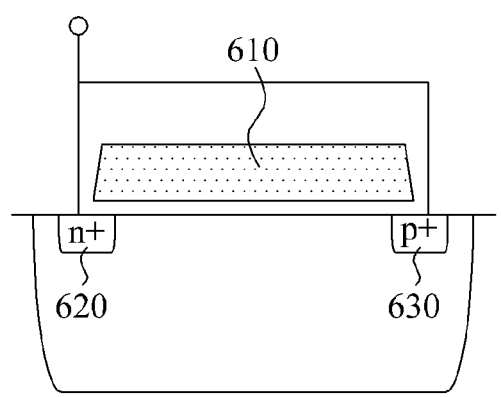
Figure 7:
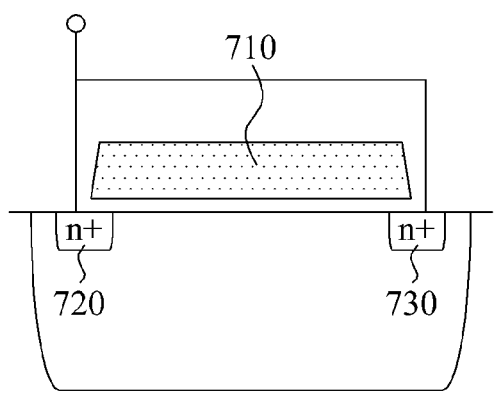

For instance, referring to FIG. 4, a first MOSFET 400 may include a p+ type diffusion region 420 and an n+ type diffusion region 430. Here, a floating gate 410 may overlap part of the n+ type diffusion region 430 and be spaced away from the p+ type diffusion region 420. Referring to FIG. 5, a first MOSFET 500 may include a floating gate 510 and a single p+ type diffusion region 520. As illustrated in FIG. 6, a first MOSFET 600 may include an n+ type diffusion region 620 and a p+ type diffusion region 630 disposed at opposite sides of a floating gate 610, overlapping the floating gate 610. As illustrated in FIG. 7, a first MOSFET 700 may include a floating gate 710 and two n+ type diffusion regions 720 and 730.

Figure 8:
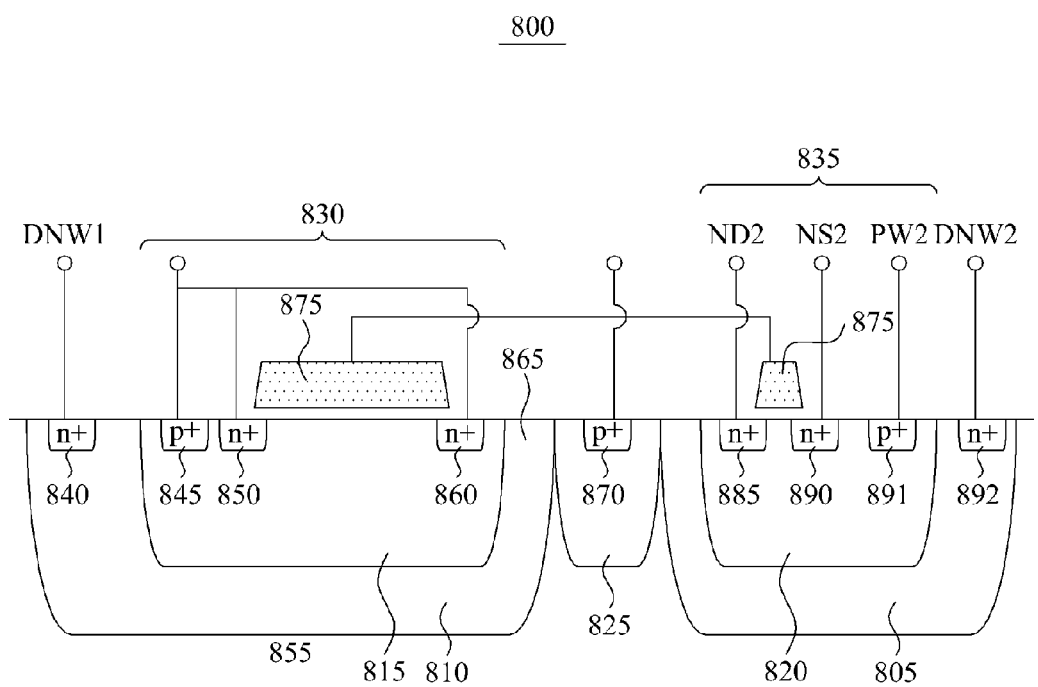
FIG. 8 is a cross-sectional view illustrating a structure of a nonvolatile memory according to another exemplary embodiment.

FIG. 8 is a cross-sectional view illustrating a structure of a nonvolatile memory of a memory cell unit according to another exemplary embodiment.

Referring to FIG. 8, the nonvolatile memory of the memory cell 800 unit may include a first deep well 810 and a second deep well 805, wherein the first deep well 810 and the second deep well 805 may include a first well 815 and a second well 820, respectively. Further, the memory cell 800 may include a floating gate 875, a first MOSFET 830 and a second MOSFET 835. The first MOSFET 830 may be disposed on the first well 815, while the second MOSFET 835 may be disposed on the conductive second well 820.

In addition, the first deep well 810 may include a diffusion region 840, which is the same type as the first deep well 810, for tying the first deep well 810. For example, when the first deep well 810 is n-type, the diffusion region 840 may be also n-type. The second deep well 805 may also include a diffusion region 892, which is the same type as the second deep well 805, for tying the second deep well 805.

When the first MOSFET 830 is an NMOS, the first MOSFET 830 may include an n-type drain 860, an n-type source 850, and a p-type tie 845. When the second MOSFET 835 is an NMOS, the second MOSFET 835 may include an n-type drain 885, an n-type source 890, and a p-type tie 891, like the first MOSFET 830. Further, a fourth well 865, which may be the same type as the first deep well 810 and be shallower than the first deep well 810, may be additionally formed in an area of the first deep well 810 where the first well 815 is not formed.

The nonvolatile memory may include at least one of a third well 825 and a diffusion region 870 between the first deep well 810 and the second deep well 805. The third well 825 or the diffusion region 870 formed between the first deep well 810 and the second deep well 805 may serve to effectively separate the first deep well 810 and the second deep well 805 and to stably provide potential of a substrate.

For example, the first deep well 810 and the second deep well 805 may be n-type, while the first well 815, the second well 820, the third well 825, and the diffusion region 870 formed between the first deep well 810 and the second deep well 805 may be p-type. In this instance, in operations of recording, deleting and reading data in the memory cell 800 included in the nonvolatile memory, a random voltage, may be applied to a terminal DNW1 connected to the first deep well 810 and a terminal DNW2 connected to the second deep well 805.

Figure 9:
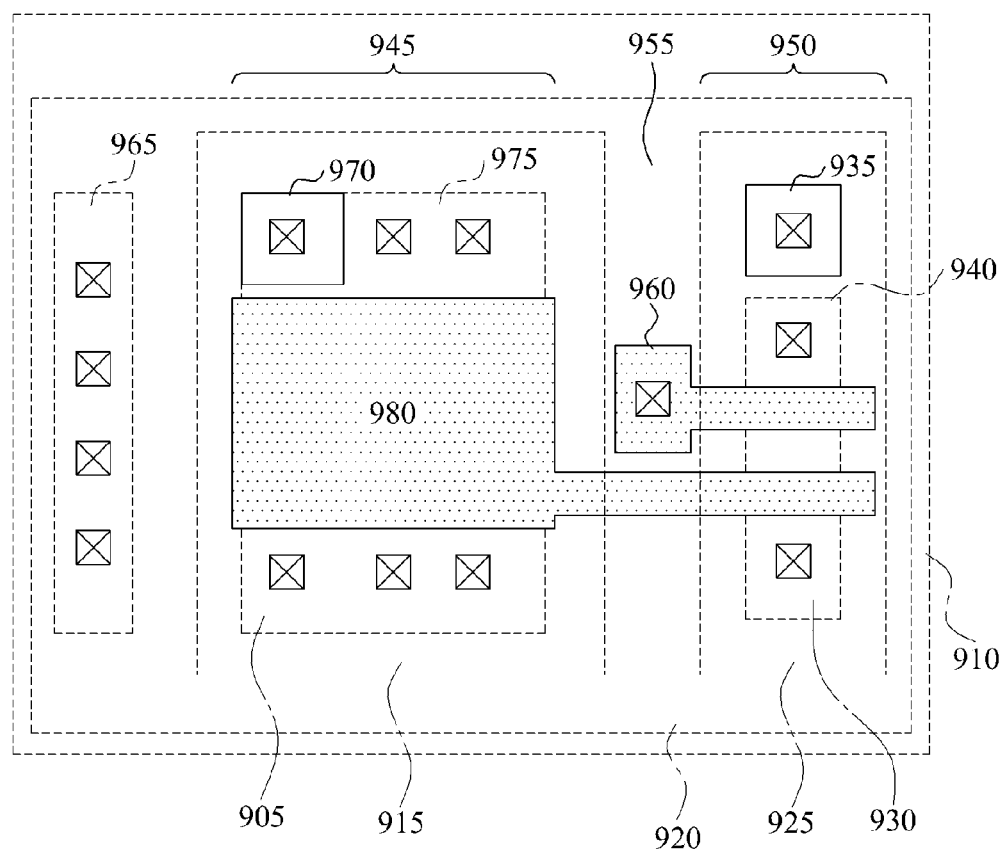
FIG. 9 is a plan view illustrating a structure of a nonvolatile memory of a memory cell unit according to still another exemplary embodiment.

FIG. 9 is a plan view illustrating a structure of a nonvolatile memory of a memory cell unit according to still another exemplary embodiment.

Referring to FIG. 9, the nonvolatile memory of the memory cell 900 unit may include a substrate 910, a conductive deep well 920, a conductive first well 915, a conductive second well 925, a floating gate 980, a first MOSFET 945, and a second MOSFET 950. In addition, the memory cell 900 may further include a selector transistor 960. The first MOSFET 945 may be disposed on the first well 905, while the second MOSFET 950 may be disposed on the second well 925.

The deep well 920 may include a diffusion region 965, which is the same type as the deep well 920, for tying the deep well 920. When the first MOSFET 945 is an NMOS, the first MOSFET 945 may include an n-type drain 905, an n-type source 975, and a p-type tie 970. When the second MOSFET 950 is an NMOS, the second MOSFET 950 may include an n-type drain 930, an n-type source 940, and a p-type tie 935, like the first MOSFET 945. Further, a third well 955, which may be the same type as the deep well 920 and be shallower than the deep well 920, may be additionally formed in an area of the deep well 920 where the first well 915 and the second well 925 are not formed.

The memory cell 900 included in the nonvolatile memory of FIG. 9 is configured to further include the selector transistor 960 as compared with the memory cell of FIG. 1. Redundant descriptions of FIG. 9 corresponding to those of FIG. 1 are omitted herein. The selector transistor 960 may contribute to diversifying power applying methods of the memory cell in operations of recording and deleting data, thereby facilitating a design of a driving circuit.

Figure 10:
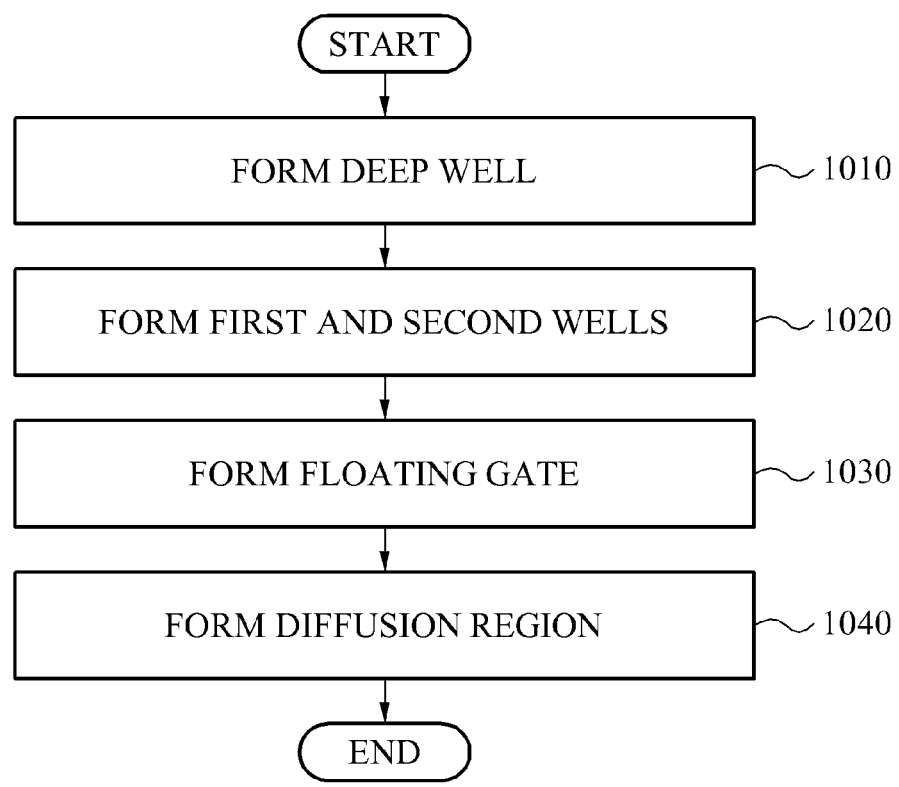
FIG. 10 is a flowchart illustrating a method of manufacturing a nonvolatile memory according to an exemplary embodiment.

FIG. 10 is a flowchart illustrating a method of manufacturing a nonvolatile memory according to an exemplary embodiment.

First, in operation 1010, a conductive deep well may be formed on a substrate. For example, an n-type deep well may be formed on a p-type substrate.

In operation 1020, a first well and a second well may be formed separately within the deep well. Further, a third well, which is shallower than the deep well, may be formed within the area of the deep well, not overlapping the first well and the second well.

Here, when the nonvolatile memory includes a plurality of memory cells, at least one of the first well and the second well may be shared between the plurality of memory cells. For example, adjacent memory cells included in the nonvolatile memory may share the first well, the second well, or the first well and the second well. Likewise, a first memory cell and a second memory cell may share the second well.

In operation 1030, a gate insulating layer may be formed on the first well and the second well, and a floating gate may be formed on the gate insulating layer. A floating gate formed on the first well and a floating gate formed on the second well may be electrically connected.

In operation 1040, a diffusion region may be formed within the deep well, the first well, and the second well. The deep well may include a diffusion region in the same type as the deep well for tying the deep well. For example, when the deep well is n-type, the diffusion region may be also n-type.

For a first MOSFET to be formed on the first well, at least one of an n+ type diffusion region and one or more p+ type diffusion regions may be formed in the first well. Likewise, for a second MOSFET to be formed on the second well, at least one of an n+ type diffusion region and one or more p+ type diffusion regions may be formed in the second well. Alternatively, a diffusion region for tying may be formed in the first well and the second well.

Each diffusion region may be connected with a terminal to which voltage is applied, and each terminal may be formed by dividing electrical wiring or connecting a plurality of wires.

Here, an operation of recording data in the nonvolatile memory may be carried out by injecting electrons into the floating gates using F-N tunneling and channel hot electron injection based on voltage applied to the first MOSFET and the second MOSFET. Further, an operation of deleting data recorded in the nonvolatile memory may be carried out by deleting electrons injected into the floating gates using F-N tunneling and band-to-band tunneling. Further, an operation of reading data recorded in the nonvolatile memory may be carried out by determining whether the second MOSFET is turned on or turned off based on presence of electrons injected into the floating gates.

For instance, describing operations 1010 to 1040, an n-type deep well may be formed on a p-type substrate. Subsequently, a p-type first well and a p-type second well, which are separated from each other, may be formed within the deep well. Further, an n-type third well, shallower than the deep well, may be additionally formed in an area of the deep well where the first well and the second well are not formed. Next, a gate insulating layer may be formed on the first well and the second well, and a floating gate may be formed on the gate insulating layer. Then, an n+ type diffusion region may be formed within an area of the deep well, and a p+ type tie region, an n+ type source region, and an n+ type drain region may be formed within the first well. Likewise, a p+ type tie region, an n+ type source region, and an n+ type drain region may be formed within the second well.

As described above, a method of manufacturing a nonvolatile memory according to an exemplary embodiment is capable of fabricating a nonvolatile memory using a complementary metal-oxide-semiconductor (CMOS) process without any additional process.

A method of manufacturing a nonvolatile memory according to an exemplary embodiment may reduce an area of a memory cell by sharing a well region of a control MOS capacitor of a memory cell with a control MOS capacitor of an adjacent memory cell or sharing a well region of a tunneling MOS capacitor of a memory cell with a tunneling MOS capacitor of an adjacent memory cell.

A method of manufacturing a nonvolatile memory according to an exemplary embodiment may reduce an area of a memory cell by including an MOS transistor for a reading operation in a well region of a tunneling MOS capacitor or using the tunneling MOS capacitor as the MOS transistor for the reading operation.

Figure 11:
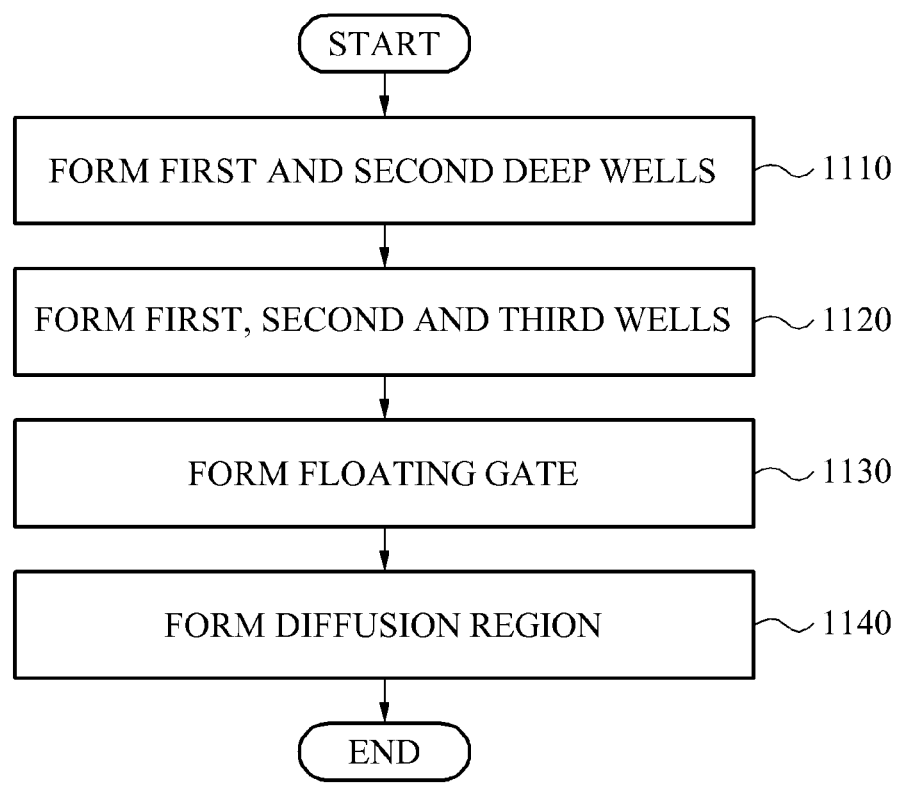
FIG. 11 is a flowchart illustrating a method of manufacturing a nonvolatile memory according to another exemplary embodiment.

FIG. 11 is a flowchart illustrating a method of manufacturing a nonvolatile memory according to another exemplary embodiment.

First, in operation 1110, a first deep well and a second deep well may be separately formed on a substrate. For example, an n-type first deep well and an n-type second deep well may be formed on the substrate.

In operation 1120, a first well may be formed within the first deep well, while a second well may be formed within the second deep well. Further, a third well may be formed between the first deep well and the second deep well. The third well may be disposed between the first well and the second well and be electrically isolated from the wells.

In operation 1130, a gate insulating layer may be formed on the first well and the second well, and a floating gate may be formed on the gate insulating layer. A floating gate formed on the first well and a floating gate formed on the second well may be electrically connected.

In operation 1140, a diffusion region may be formed within the deep wells, the first well, the second well, and the third well. The deep wells may include a diffusion region in the same type as the deep wells for tying the deep wells. For example, when the deep wells are n-type, the diffusion region may be also n-type.

For a first MOSFET to be formed on the first well, at least one of an n+ type diffusion region and one or more p+ type diffusion regions may be formed in the first well. Likewise, for a second MOSFET to be formed on the second well, at least one of an n+ type diffusion region and one or more p+ type diffusion regions may be formed in the second well. Alternatively, a diffusion region for tying may be formed in the first well and the second well. In addition, a p+ type diffusion region may be formed within the third well.

Each diffusion region may be connected with a terminal to which voltage is applied, and each terminal may be formed by dividing electrical wiring or connecting a plurality of wires.

For instance, describing operations 1110 to 1140, an n-type first deep well and an n-type second deep well may be formed on a p-type substrate. Subsequently, a p-type first well may be formed within the first deep well, and a p-type second well may be formed within the second deep well. Further, a p-type third well may be formed between the first deep well and the second deep well. Next, a gate insulating layer may be formed on the first well and the second well, and a floating gate may be formed on the gate insulating layer. Then, an n+ type diffusion region may be formed within the first deep well and the second deep well, and a p+ type tie region, an n+ type source region, and an n+ type drain region may be formed within the first well. Likewise, a p+ type tie region, an n+ type source region, and an n+ type drain region may be formed within the second well. A p+ type diffusion region may be formed within the third well.

While the present invention has been shown and described with reference to a few exemplary embodiments and the accompanying drawings, it will be apparent to those skilled in the art that various modifications and variations can be made in the present invention without departing from the spirit or scope of the invention. For example, adequate effects of the present invention may be achieved even if the foregoing processes and methods may be carried out in different order than described above, and/or the aforementioned elements, such as systems, structures, devices, or circuits, may be combined or coupled in different forms and modes than as described above or be substituted or switched with other components or equivalents. Thus, it is intended that the present invention cover the modifications and variations of this invention provided they come within the scope of the appended claims and their equivalents.

What is claimed is:

1. A nonvolatile memory comprising:
    a plurality of memory cells, wherein each of the memory cells comprises:
        a deep well formed on a substrate;
        a first well formed within the deep well;
        a second well formed within the deep well, separately from the first well within the deep well;
        a first metal-oxide-semiconductor field-effect transistor (MOSFET) formed on the first well; and
        a second MOSFET formed on the second well,
    wherein at least one of the first and second wells is shared between adjacent memory cells in the nonvolatile memory; and
    wherein the nonvolatile memory applies a first voltage for recording data to at least one of a source region, a drain region and a well region of the first MOSFET so as to record data in the memory, applies a preset voltage to the second well shared between a memory cell included in the nonvolatile memory and a memory cell adjacent to the memory cell, applies a preset voltage to at least one of a source region and a drain region of the second MOSFET, and controls to 0 V or float a source region and a drain region of a second MOSFET included in a memory cell not selected for recording the data, so that electrons are injected into a floating gate of the second MOSFET by tunneling.

2. The nonvolatile memory of claim 1, wherein the deep well comprises a conductive deep N-well, the first and second wells comprise a conductive P well, and the first and second MOSFETs are a conductive NMOS.

3. The nonvolatile memory of claim 1, wherein the nonvolatile memory applies a first voltage for recording data to the first MOSFET, applies a preset voltage to the second well and the second MOSFET, constantly maintains a voltage of the second well, and applies a different voltage to a source/drain of the second MOSFET from that of an adjacent memory cell to record data only in a selected memory cell.

4. A nonvolatile memory comprising:
    a plurality of memory cells, wherein each of the memory cells comprises:
        a deep well formed on a substrate;
        a first well formed within the deep well;
        a second well formed within the deep well, separately from the first well within the deep well;
        a first metal-oxide-semiconductor field-effect transistor (MOSFET) formed on the first well; and
        a second MOSFET formed on the second well,
    wherein at least one of the first and second wells is shared between adjacent memory cells in the nonvolatile memory; and
    wherein the nonvolatile memory applies a second voltage for deleting data to at least one of a source region, a drain region and a well region of the first MOSFET so as to delete data recorded in the memory, applies a preset voltage to the second well shared between a memory cell included in the nonvolatile memory and a memory cell adjacent to the memory cell, applies a preset voltage to at least one of a source region and a drain region of the second MOSFET, and controls to 0 V or float a source region and a drain region of a second MOSFET included in a memory cell not selected for deleting the data, so that electrons are removed from a floating gate of the second MOSFET by tunneling.

5. A nonvolatile memory comprising:
a plurality of memory cells, wherein each of the memory cells comprises:
   a deep well formed on a substrate;
   a first well formed within the deep well;
   a second well formed within the deep well, separately from the first well within the deep well;
   a first metal-oxide-semiconductor field-effect transistor (MOSFET) formed on the first well; and
   a second MOSFET formed on the second well,
wherein at least one of the first and second wells is shared between adjacent memory cells in the nonvolatile memory; and
wherein the nonvolatile memory applies a second voltage for deleting data to at least one of a source region, a drain region and a well region of the first MOSFET so as to delete data recorded in the memory, applies a voltage of 0 V or a preset voltage to the second well shared between a memory cell included in the nonvolatile memory and a memory cell adjacent to the memory cell, applies a voltage of 0 V to a source region of the second MOSFET, applies a preset voltage to a drain region of the second MOSFET, and controls to 0 V or float a drain region of a second MOSFET included in a memory cell not selected for deleting the data, so that a negative voltage is induced in a floating gate of the second MOSFET and holes generated in a channel region of the second MOSFET by impact ionization are injected into the floating gate of the second MOSFET.

6. The nonvolatile memory of claim 1, wherein the first MOSFET comprises at least one of one or more n+ type diffusion regions and one or more p+ type diffusion regions.

7. The nonvolatile memory of claim 1, further comprising a selector transistor formed on the second well.

8. A nonvolatile memory comprising:
a plurality of memory cells, wherein each of the memory cells comprises:
   a deep well formed on a substrate;
   a first well formed within the deep well;
   a second well formed within the deep well, separately from the first well within the deep well;
   a first metal-oxide-semiconductor field-effect transistor (MOSFET) formed on the first well; and
   a second MOSFET formed on the second well,
wherein at least one of the first and second wells is shared between adjacent memory cells in the nonvolatile memory; and
wherein the nonvolatile memory applies a first voltage for recording data to at least one of a source region, a drain region and a well region of the first MOSFET so as to record data in the memory, applies a voltage of 0 V to the second well shared between a memory cell included in the nonvolatile memory and a memory cell adjacent to the memory cell, applies a voltage of 0 V to a source region of the second MOSFET, applies a preset voltage to a drain region of the second MOSFET, and controls to 0 V or float a drain region of a second MOSFET included in a memory cell not selected for recording the data, so that channel hot electrons generated in a channel region of the second MOSFET are injected into a floating gate of the second MOSFET.

9. A nonvolatile memory comprising:
a plurality of memory cells, wherein each of the memory cells comprises:
   a first deep well formed on a substrate;
   a first well formed within the first deep well;
   a first metal-oxide-semiconductor field-effect transistor (MOSFET) formed on the first well;
   a second deep well formed on the substrate, separately from the first deep well on the substrate;
   a second well formed within the second deep well; and
   a second MOSFET formed on the second well,
wherein at least one of the first and second wells is shared between adjacent memory cells in the nonvolatile memory; and
wherein the nonvolatile memory applies a first voltage for recording data to at least one of a source region, a drain region and a well region of the first MOSFET so as to record data in the memory, applies a preset voltage to the second well shared between a memory cell included in the nonvolatile memory and a memory cell adjacent to the memory cell, applies a preset voltage to at least one of a source region and a drain region of the second MOSFET, and controls to 0 V or float a source region and a drain region of a second MOSFET included in a memory cell not selected for recording the data, so that electrons are injected into a floating gate of the second MOSFET by tunneling.

10. The nonvolatile memory of claim 9, wherein the first and second deep wells comprise a conductive deep N-well, the first and second wells comprise a conductive P well, and the first and second MOSFETs are a conductive NMOS.

11. The nonvolatile memory of claim 9, further comprising a third well formed between the first deep well and the second deep well to separate the first deep well from the second deep well.

12. The nonvolatile memory of claim 9, further comprising a selector transistor formed on the second well.

13. The nonvolatile memory of claim 9, wherein the nonvolatile memory applies a preset voltage to a shared well region of the second MOSFET and applies a different voltage to a source and a drain of the second MOSFET included in a selected memory cell from that of an adjacent memory cell to record data only in the selected memory cell or to delete data recorded in the selected memory cell.

* * * * *